US008904266B2

(12) United States Patent
Tang et al.

(10) Patent No.: US 8,904,266 B2
(45) Date of Patent: Dec. 2, 2014

(54) MULTI-STANDARD VITERBI PROCESSOR

(75) Inventors: Weihua Tang, Eindhoven (NL); Nur Engin, Eindhoven (NL); Frits Anthonie Steenhof, Waalre (NL); Marc Klaassen, Waalre (NL); Andries Pieter Hekstra, Eindhoven (NL); Sergie Valerjewitsch Sawitzki, Heist (DE)

(73) Assignee: NXP, B.V., Eindhoven (NL)

( * ) Notice: Subject to any disclaimer, the term of this patent is extended or adjusted under 35 U.S.C. 154(b) by 1102 days.

(21) Appl. No.: 12/853,589

(22) Filed: Aug. 10, 2010

(65) Prior Publication Data
US 2012/0042229 A1 Feb. 16, 2012

(51) Int. Cl.
*H03M 13/17* (2006.01)
*H03M 13/00* (2006.01)
*H03M 13/41* (2006.01)

(52) U.S. Cl.
CPC ...... *H03M 13/4176* (2013.01); *H03M 13/6519* (2013.01); *H03M 13/4107* (2013.01); *H03M 13/4169* (2013.01)
USPC ....................................................... 714/795

(58) Field of Classification Search
CPC .............. H03M 13/39; H03M 13/395; H03M 13/3972; H03M 13/15; H03M 13/17; H03M 13/4107; H03M 13/4169; H03M 13/4176; H03M 13/6331; H03M 13/6519; H04L 1/0054; H04L 1/006
USPC ....................................................... 714/795
See application file for complete search history.

(56) References Cited

U.S. PATENT DOCUMENTS

| 5,272,706 | A | 12/1993 | Park |
| 5,942,003 | A | 8/1999 | Ivry |
| 5,996,103 | A | 11/1999 | Jahanghir |
| 6,081,919 | A | 6/2000 | Fujiwara et al. |
| 6,108,811 | A | 8/2000 | Nakamura et al. |
| 6,219,388 | B1* | 4/2001 | Tanada et al. ............... 375/341 |
| 6,334,201 | B1 | 12/2001 | Sawaguchi et al. |
| 6,877,132 | B1 | 4/2005 | De et al. |
| 7,228,489 | B1 | 6/2007 | Boyer |
| 7,424,071 | B2 | 9/2008 | Allpress et al. |

(Continued)

FOREIGN PATENT DOCUMENTS

| EP | 0801501 A | 10/1997 |
| WO | 2006026334 A | 3/2006 |

OTHER PUBLICATIONS

Lupin Chen, Modified VLSI Designs for Error Correction Codes, Sep. 4, 2007, Oregon State University.*

(Continued)

*Primary Examiner* — Amine Riad

(57) ABSTRACT

Various embodiments relate to a multi-standard Viterbi decoder. Based on programmable values for constraint length, generator polynomials, and code rate, the multi-standard Viterbi decoder may adhere to a specific convolutional code standard. At a given time, the multi-standard Viterbi decoder may receive a variety of convolutional codes through a channel and may process them using various forms of the trace back method. Various embodiments include a branch metric unit and path metric unit that include a variety of sub-units that may or may not be active based on the value of the programmable value. Various embodiments also enable the multi-standard Viterbi decoder to handle different forms of convolutional codes, such as tail-biting codes. In some embodiments, the multi-standard Viterbi decoder may also process at least two convolutional codes concurrently.

14 Claims, 10 Drawing Sheets

(56) References Cited

U.S. PATENT DOCUMENTS

| | | | |
|---|---|---|---|
| 7,478,315 B1* | 1/2009 | Hennecken et al. | 714/795 |
| 7,620,819 B2* | 11/2009 | Phoha et al. | 713/186 |
| 7,644,338 B2* | 1/2010 | Park et al. | 714/758 |
| 7,814,394 B2* | 10/2010 | Lee et al. | 714/758 |
| 7,904,794 B2* | 3/2011 | Park et al. | 714/781 |
| 8,009,773 B1 | 8/2011 | Kankipati et al. | |
| 8,433,975 B2 | 4/2013 | Hekstra et al. | |
| 8,566,683 B2 | 10/2013 | Hekstra et al. | |
| 2002/0174402 A1 | 11/2002 | Yamamoto | |
| 2003/0212950 A1 | 11/2003 | Chen et al. | |
| 2005/0262423 A1 | 11/2005 | Liu et al. | |
| 2007/0168847 A1 | 7/2007 | Pisek et al. | |
| 2009/0070658 A1 | 3/2009 | Patapoutian et al. | |
| 2009/0187813 A1* | 7/2009 | Haratsch | 714/795 |
| 2010/0322359 A1* | 12/2010 | Stockmanns et al. | 375/341 |
| 2011/0161787 A1 | 6/2011 | Hekstra et al. | |

OTHER PUBLICATIONS

Raghavan et al, "A Reliability Output Viterbi Algorithm with Applications to Hybrid ARQ", IEEE Transactions on Information Theory, vol. 44, No. 3, May 1998, pp. 1214-1216.

Hagenauer et al, "A Viterbi Algorithm with Soft-Decision Outputs and its Applications", IEEE, pp. 1680-1686.

Harada et al, "Performance of the Concatenated Coding System with a Modified Erasure Declaration Viterbi Decoder", IEEE, pp. 1231-1235.

Deng et al, "High Rate Concatenated Coding Systems Using Bandwidth Efficient Trellis Inner Codes", IEEE 1989, pp. 420-427.

Yeo et al, "Implementation of High Throughput Soft Output Viterbi Decoders", IEEE 2002, pp. 146-151.

Pribylov et al, "A Convolutional Code Decoder Design Using Viterbi Algorithm with Register Exchange History Unit", IEEE 2005, pp. 10-15.

Qian et al, "Reduced-Complexity Soft-Output Viterbi Equalizer", International Conference on Communication Technology, 1998, pp. S13-07-01 to S13-07-05.

Ryan, "Comparative Performance Between Drop-Out Detection and Viterbi Reliability Metric Erasure Flagging", IEEE Transactions on Magnetics, vol. 28, No. 5, 1992, pp. 2898-2900.

Hekstra et al, "Bitwise Reliability Indicators Derived From Counts of Survivor Paths Bits in Viterbi Decoders", pp. 1-5.

Swaminathan et al, "A Dynamically Reconfigurable Adaptive Viterbi Decoder", Department of Electrical and Computer Engineering, University of Massachusetts (10 pages).

European Search Report in related application EP 11 17 5619 dated Jun. 4, 2012.

Hocevar D.E. et al , "Achieving flexibility in a viterbi decoder DSP coprocessor," Vehicular Technology Conference, 2000, IEEE VTS Fall VTC 2000, vol. 5, Sep. 24, 2000, pp. 22-57-2264.

Bissi et al., "A multi-standard reconfigurable viterbi decoder using embedded FPGA Blocks," Digital System Design: Architectures, Methods and Tools, 2006, DSD 2006, 9th EuroMicro Conference on IEEE, PL, Jan. 1, 2006, pp. 146-154.

Hendrix H., "Viterbi decoding techniques in TMS320C54x Family", Texas Instruments Technical Journal, Texas Instruments, Jun. 1, 1196, pp. 1-20.

Cox, Richard et al., An efficient adaptive circular viterbi algorithm for decoding generalized tailbiting convolutional codes, IEEE Transactions on Vehicular Technology, vol. 43, No. 1, Feb. 1994.

Fricke, J.C. et al., "Word error probability estimation by means of a modified viterbi decoder," IEEE Vehic. Techn. Conf. (VTC) 2007, pp. 1113-1116, Sep. 2007.

Nill C. et al., "List and soft-symbol output VAs: extensions and comparisons," IEEE Trans. on Commun., vol. 43, Nos. 2-4, pp. 277-287, Feb./Mar./Apr. 1995.

Swaminathan, S. et al., "A dynamically reconfigurable adaptive viterbi decoder,"Department of Electrinical and Computer Engineering, University of Massachusetts (10 pages), Proc. of the 2002 ACM/SIGDA Tenth Int'l Symposium on FPGAs, pp. 227-236.

Shahzad, S. et al. "Self-Correcting Codes Conquer Noise Part One: Viterbi Codes", EDN, vo. 46, No. 4, 11 pgs (Feb. 15, 2001).

Proakis, J. G. et al. "Telecommunications—Convolutional Codes", vol. 1, Wiley Encyclopedia of Telecommunications, 11 pgs, (2003).

* cited by examiner

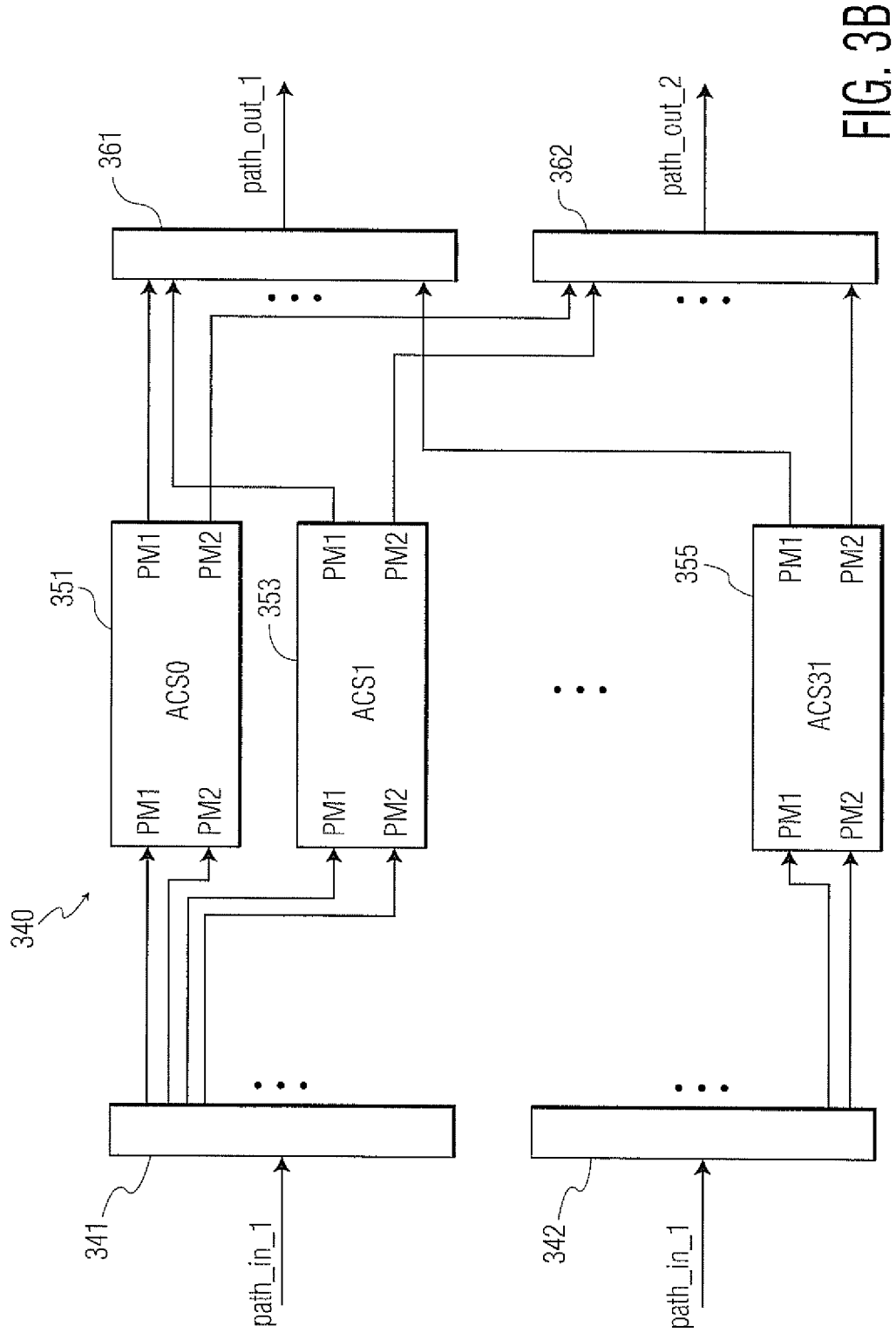

MULTI-STANDARD VITERBI PROCESSOR

TECHNICAL FIELD

Various exemplary embodiments disclosed herein relate generally to convolutional codes and Viterbi decoders.

BACKGROUND

Modern communications systems are generally required to transmit data at both high rates and with little error. To satisfy such requirements, many communications systems employ error-control code to enhance system performance. Convolutional codes are a popular choice as codes used for error correction, due to both their capacity and reasonable coding simplicity. For example, convolutional codes are regularly used in various digital communications standards, such as DVB-T (Digital Video Broadcast-Terrestrial), which requires an average bit error rate (BER) of $2 \times 10^{-4}$ for quasi error-free (QEF) operation. ISDB-T (Integrated Service Digital Broadcasting-Terrestrial) is another standard that also employs convolutional codes and may require a similar BER for regular operation. One subclass of convolutional codes used by various standards is the class including tail-biting codes. Several standards, such as HD-radio and LTE use such codes, as the last information bits are used as initial states of the encoder. However, each standard usually requires specific requirements for decoding and require extensive modification when switching between standards that use different formats of convolutional codes.

A current trend in consumer and communication service provider products is an integration of different communications standards within a single device. For example, a single device may require support for multiple standards that enable mobile broadcasts, wireless networking, and cellular networking. However, for each of the available standards, the parameters that defined such standards may be different, resulting in different design requirements for a Viterbi decoder.

Some existing solutions use software Viterbi decoders that may adapt to approximate dedicated hardware versions. However, such software solutions generally have a limited bandwidth (i.e., only up to a few Mbps). When Viterbi hardware is used, designers have been forced to install separate decoders for each standard. The drawbacks associated with this solution are that it requires a large amount of silicon area on any chip and that single-standard hardware Viterbi decoders may not later be used to support future standards.

In view of the foregoing, it would be desirable to improve support for multiple standards in Viterbi decoders. In particular, it would be desirable to construct hardware Viterbi decoders capable of handling a range of parameters associated with different standards.

SUMMARY

In light of the present need for a robust Viterbi decoder, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may relate to a multi-standard Viterbi processor that decodes a convolutional code. The processor may comprise a branch metric unit (BMU) comprising a plurality of branch sub-units that receives a first plurality of input bits from a main memory and outputs a first series of branch metrics, wherein the number of active branch sub-units of the plurality of branch sub-units is based on a programmable generator polynomial and a programmable code rate. The processor may also comprise a path metric unit (PMU) comprising a plurality of add-compare-select (ACS) units that receive the first series of branch metrics through a plurality of interconnects and output a first series of path metrics, wherein the configuration of the interconnects is based on a programmable constraint length. The processor may also comprise a number of active path metric registers in a plurality of path metric registers that receives the first series of path metrics and output a second series of path metrics, wherein the number of active path metrics registers from the plurality of path metric registers is based on the programmable constraint length.

Various embodiments may also relate to a method for a Viterbi decoder to decode a convolutional code. The method may comprise a branch metric unit (BMU) comprising a plurality of branch sub-units receiving a first plurality of input bits from a main memory, wherein the number of active branch sub-units of the plurality of branch sub-units is based on a programmable generator polynomial and a programmable code rate. The method may also comprise a path metric unit (PMU) comprising a plurality of add-compare-select (ACS) units receiving a first series of branch metrics transmitted from the BMU through a plurality of interconnects, wherein the configuration of the interconnects is based on a programmable constraint length. The method may also comprise a number of active path metric registers in a plurality of path metric registers receiving a first series of path metrics transmitted from the PMU, wherein the number of active path metric registers from the plurality of path metric registers is based on the programmable constraint length. The method may also comprise the number of active path metric registers outputting a second series of path metrics.

It should be apparent that, in this manner, various exemplary embodiments enable a dynamically programmable Viterbi decoder. Particularly, by basing the functionality of sub-components of the branch metric unit and the path metric unit on programmable values associated with different standards, the multi-standard Viterbi decoder may dynamically change its functionality for different standards without dedicated hardware or while greatly sacrificing efficiency.

BRIEF DESCRIPTION OF THE DRAWINGS

In order to better understand various exemplary embodiments, reference is made to the accompanying drawings wherein:

FIG. 3B illustrates a functional block of an exemplary path metric computation unit (PMCU);

DETAILED DESCRIPTION

Figure 1A:
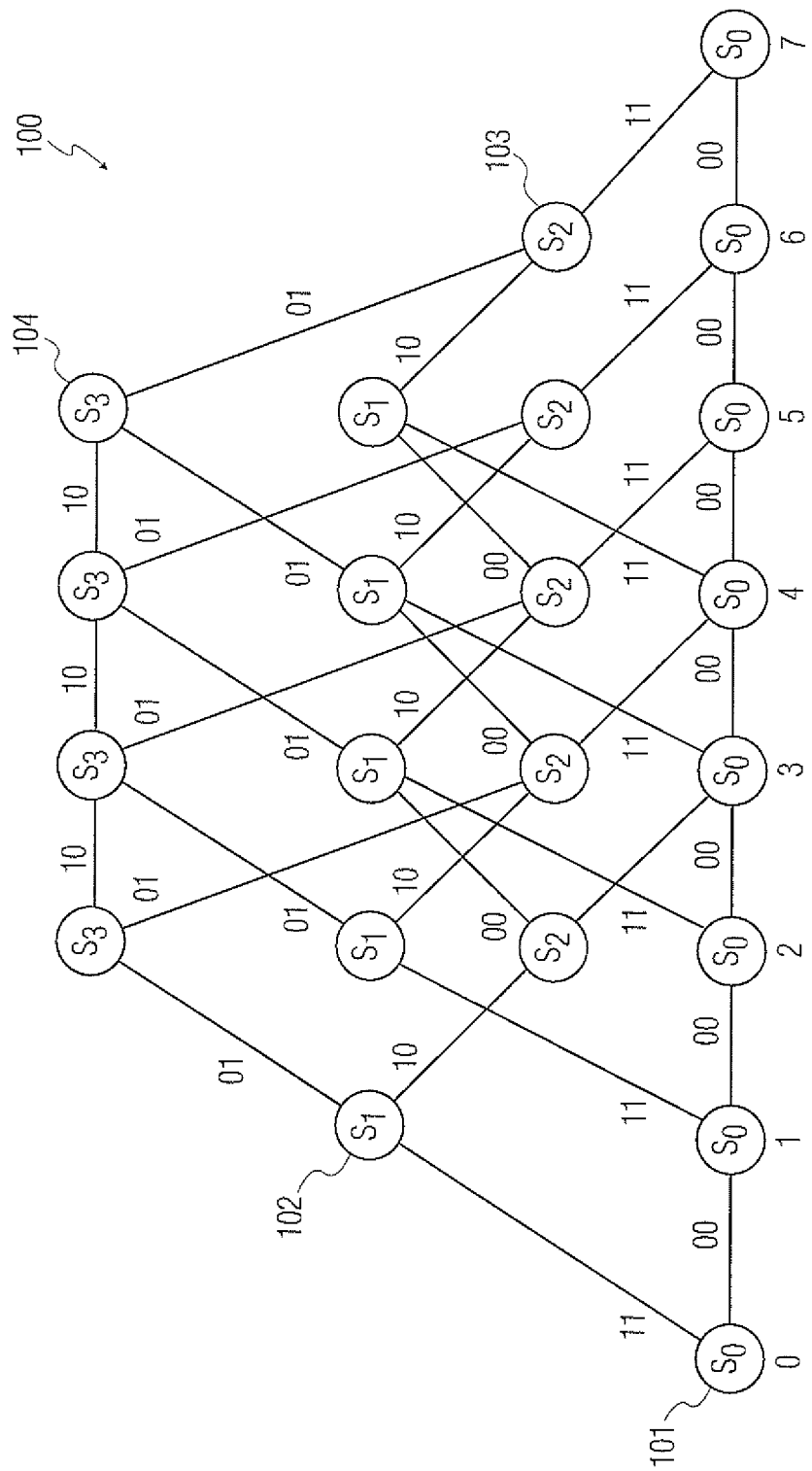
FIG. 1A illustrates a trellis diagram of an exemplary binary convolutional code.

Referring now to the drawings, in which like numerals refer to like components or steps, there are disclosed broad aspects of various exemplary embodiments.

FIG. 1A illustrates a trellis diagram of an exemplary binary convolutional code. A Viterbi decoder may receive input bits from binary convolutional codes. The binary convolutional code may be represented as (n, k, m), where a binary convolutional encoder produces n output bits by combining k input bits and the previous mk (where m is the memory order of the convolutional code) input bits. The Viterbi decoder may receive the binary convolutional code output sequence of n length, reconstruct, and output the k input bits of the original input sequence with a high probability. The possibilities of the binary convolutional code may be represented by a code tree that presents every codeword (i.e., code sequence) as a path on the tree. For example, an input sequence of L bits will have a corresponding code tree consisting of (L+m+1) levels, with the leftmost node at level 0 being the origin node and the rightmost nodes at level (L+m) being the terminal nodes. For the first L levels, there may be $2^k$ branches leaving each node. For nodes at levels L through (L+m), only one branch may leave from each node. Each path from the origin node to a terminal node may define a code path and may correspond to a distinct codeword. The codeword may form the output of the binary convolutional encoder for one period of its shift register.

Code trellis 100, therefore, may be a corresponding structure that may be obtained from a code tree by merging all nodes in the code tree that are in the same state. In the illustrated embodiment, for example, the code trellis 100 comprises a series of 8 levels that shows transitions between four states, $S_0$-$S_3$ 101-104. Due to the merging of nodes in the same state, only one terminal node may remain in a trellis, as all terminal nodes may merge to the same, final state. Similarly, each path from the origin node to the terminal node may represent a distinct codeword. Accordingly, an S-level trellis may have $2^{S-1}$ paths and $2^{S-1}$ codewords.

In the illustrative embodiment, the code trellis 100 contains a number of states 101-104 and stages 0 to 7. In the code trellis 100, each transition between states (e.g., from $S_0$ 101 to $S_1$ 102) may possess a corresponding metric or distance that may be defined as a branch metric. In some embodiments, a Viterbi decoder may calculate the branch metrics for each state transition. In some embodiments, the Viterbi decoder may also store a limited number of paths that possess the shortest distances relative to the received sequence through the combination of branch metrics. These paths stored by the Viterbi decoder may be defined as survivor paths.

In some embodiments, the branch metrics may comprise a plurality of metrics like the normalized distances between a possible reachable symbol in the code alphabet and the received symbol. A hard-decision Viterbi decoder may receive a symbol in the signal and may calculate Hamming distances between the received symbol and the symbols in the code alphabet. For example, a hard-decision Viterbi decoder, upon receiving the symbol $S_0$ at stage 5, may calculate the Hamming distances between the received symbol and $S_0$ and each of the $S_0$-$S_2$ symbols, respectively. Similarly, a soft-decision Viterbi decoder may substitute the calculation of the Hamming distance for the calculation of a reliability (e.g., probability) value, such as a squared Euclidean distance, for a received signal. In some embodiments, the Viterbi decoder may compare the overall distance between the received sequence and corresponding survivor paths. In such instances, the survivor path with the smallest calculated distance for the entire sequence may be the most reliable.

Figure 1B:
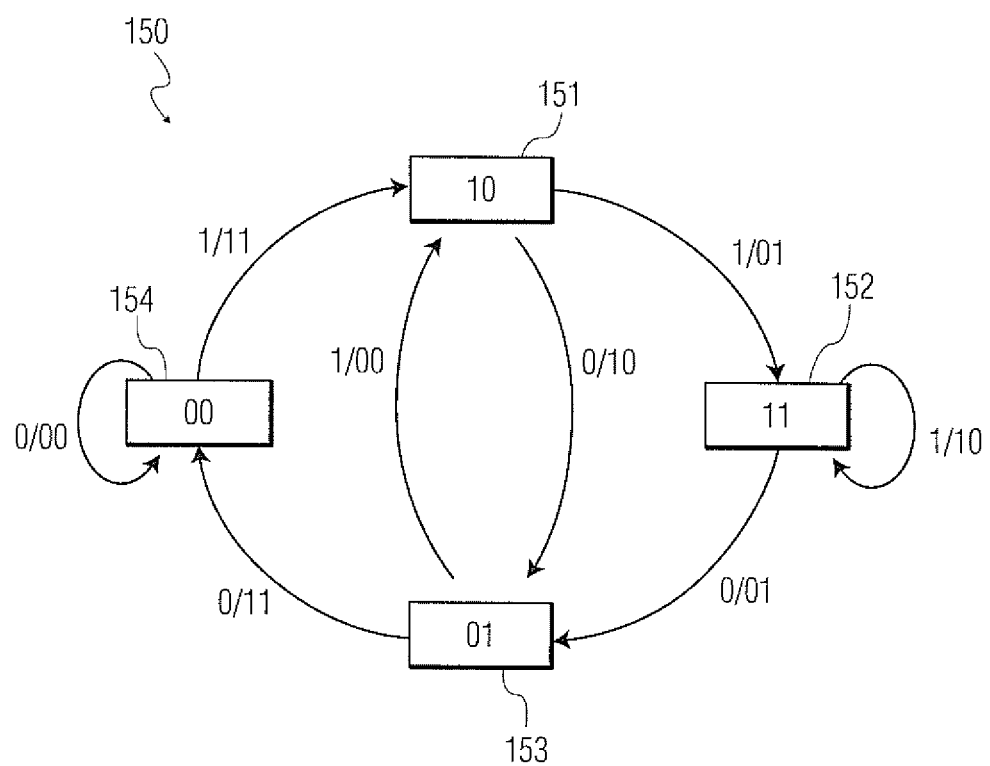
FIG. 1B illustrates a state diagram of a corresponding exemplary binary convolutional code.

FIG. 1B illustrates a state diagram of a corresponding exemplary binary convolutional code. As will be discussed in further detail below in relation to FIG. 2B, a binary convolutional encoder (not shown) may be a device component that outputs a binary convolutional codeword. The convolutional codeword that is output from the binary convolutional encoder may be used, for example, as a component in an error correcting code. In some embodiments, the binary convolutional encoder may include a plurality of shift registers and modulo-2 (mod-2) adders. The output bits of the binary convolutional encoder may be modulo-2 additions of selective shift register contents and present input bits, which may result in a code rate of ½. More general convolutional codes with a ratio of number of message bits to number of coded bits may be different from ½ and may have multiple input and output bits per trellis section.

The binary convolutional encoder may also be implemented as a finite state machine (FSM). In such an implementation, the contents of the shift registers may represent the various states 151-154 of the FSM. Therefore, the output of the FSM at a given time may depend on the current state of the machine. For the binary convolutional encoder, each change of state 151-154 may be represented with the input of an input bit and the output of an output bit.

FIG. 1B shows state diagram 150 of the binary convolutional encoder. State diagram 150 comprises a number of possible states 151-154, with state transitions between each state. Each possible state transition is labeled with the corresponding input and output (i.e., 0/11 represents input bit 0 and output bits 11). The trellis 100 of FIG. 1A may illustrate a number of possible state sequences for state diagram 150 of binary convolutional encoder when given a specific initial state. For example, if the initial state in the illustrative embodiment corresponds with state "01" 153, then $S_1$ 101 at level 1 corresponds to state "00" 154 and $S_2$ 102 at level 1 corresponds to state "10", respectively. [software disclaimer:] It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

Figure 2:
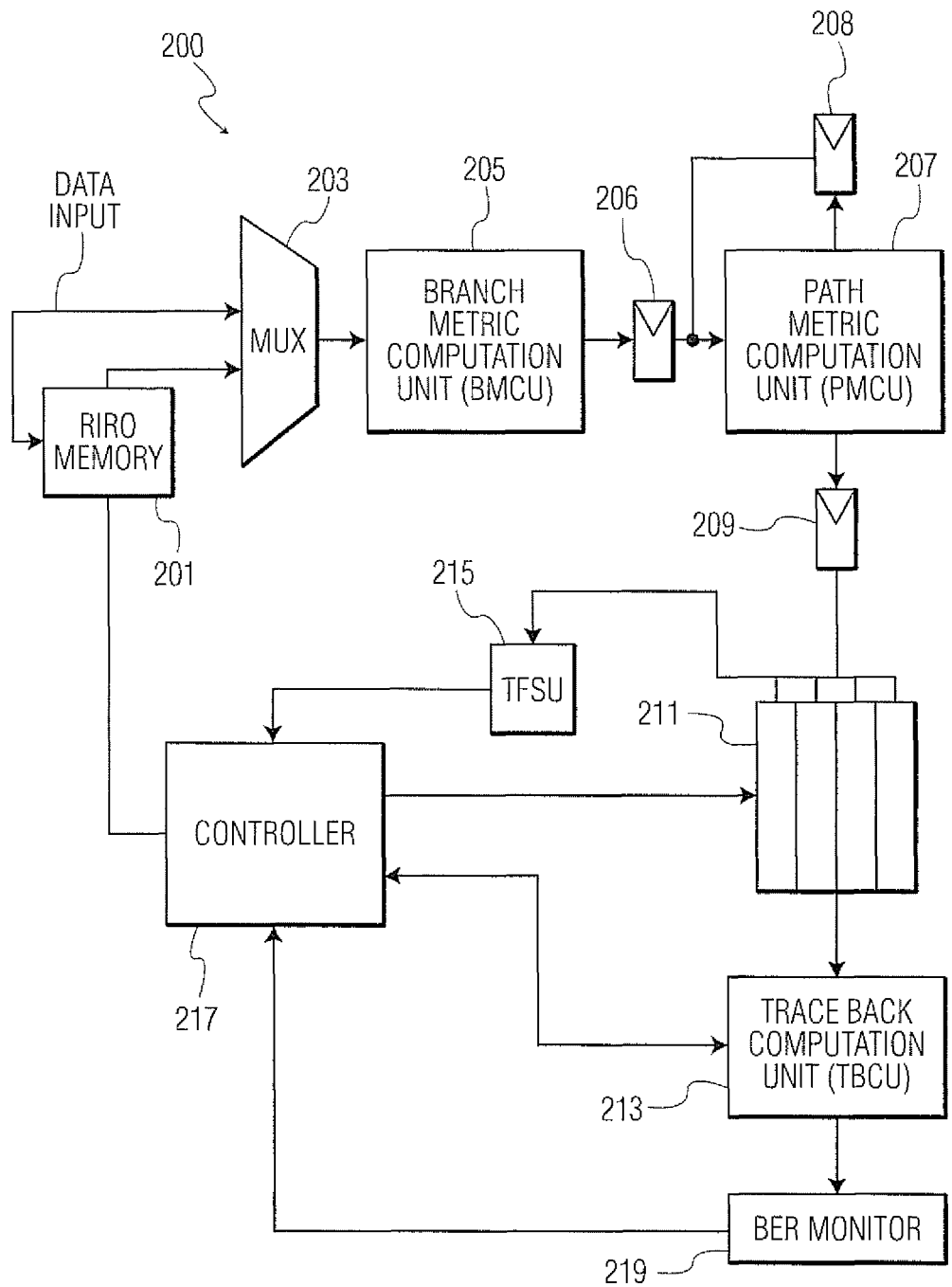
FIG. 2 illustrates functional block of an exemplary Viterbi decoder.

FIG. 2 illustrates a functional block of an exemplary Viterbi decoder. Viterbi decoder 200 may be a component of a computer system that decodes bit streams that were encoded with a binary convolutional codeword. The Viterbi decoder 200 may receive one or more input bits from a convolutional code and may produce a decoded sequence by processing the incoming bits. Viterbi decoder 200 may contain various components shown in FIG. 2, in addition to other components not shown in FIG. 2, but that may be identified by a person of ordinary skill in the art upon reading this disclosure. An exemplary Viterbi decoder 200 may, for example, include a run-in run-out (RIRO) memory 201, a multiplexer 203, a Branch Metric Computation Unit (BMCU) 205, a Path Metric Computation Unit (PMCU) 207, a trace back memory (TBM) 211, a trace back computation unit (TBCU) 213, a trace forward and select unit (TFSU) 215, and a controller 217. Some embodiments may also include a plurality of registers 206, 208, 209 and bit error rate (BER) monitor 219. Some embodiments may have one or more of the components, such as the RIRO memory 201 and/or the TBM 211 located outside the Viterbi decoder 200. It will be understood that FIG. 2 is a functional diagram representing one example implementation of one Viterbi decoder 200 according to one embodiment; other hardware implementations may be different, yet contain the same functionality as that described and illustrated herein. In an exemplary operation, the Viterbi decoder 200 may receive a series of input bits forming a binary convolutional codeword and decode the input bits using the Viterbi algorithm to obtain, with high probability, the optimal survivor path representing the sequence that entered the binary convolutional encoder.

Branch Metric Computation Unit (BMCU) 205 may receive a series of input bits, starting with the terminal bit from a transmission or storage channel, and may calculate the corresponding branch metrics from these inputs. In some embodiments, the branch metrics may be defined as a normalized distance between nodes in the code trellis 100. As an example, when the Viterbi decoder 200 is a hard-decision Viterbi decoder, the BMCU 201 may calculate Hamming distances for the 11 and 00 transitions between the stage 7 and stage 6 (shown in FIG. 1A) from state $S_0$ to states $S_2$ and $S_0$, respectively. The branch metrics may therefore represent the cost of traversing along a specific branch between needs in the code trellis 100. The hard-decision Viterbi decoder may receive the bitstream on its input and may use the calculated Hamming distance as its branch metric. Comparatively, a soft-decision Viterbi decoder may similarly receive a bitstream and produce branch metrics containing information regarding the reliability of each of the received symbols. This may be done by the BMCU 205 of a soft-decision Viterbi decoder calculating the squared Euclidean distance as the branch metric. In some embodiments, the BMCU 205 or other components in the Viterbi decoder 200 may use the relative Euclidean distances to determine the relative reliabilities of a plurality of survivor paths. In some embodiments, the BMCU 205 may calculate new branch metrics for each input bit during every clock cycle, as, during each clock cycle, the BMCU 201 may receive a new input bit that represents a new level in the trellis.

Path Metric Computation Unit (PMCU) 207 may comprise a series of Add-Compare-Select (ACS) units that receive the plurality of branch metrics produced by the BMCU 205 and recursively accumulate the branch metrics as path metrics for a plurality of possible paths through the code trellis 100. The configuration of the plurality of ACS units may be based on the arrangement of the code trellis 100 representing the received convolutional codeword. PMCU 207 may then compare the accumulated path metrics with each other for a given level in the trellis. In some embodiments, the PMCU 207 may also make a decision by selecting the most likely state transition that would constitute an applicable survivor path, generating a plurality of decision bits corresponding to the chosen state transition. Path metrics, also known as state metrics, may collect the total minimum cost of arriving into a specific state from an initial state, which may be in the form of a sum of a series of connected branch metrics. Such a cost function may be in the form of, for example, a function based on the decreasing likelihood of the path between the initial state and the specific state. When constructing the path metric using the trace back method, the "initial state" may be the last signal in a decoded sequence, with the "specific state" being the oldest state saved in the survivor path. A commonly-used function in implementation for such a function of likelihood may be, for example, the logarithmic or log-likelihood functions.

In some embodiments, the add-compare-select (ACS) algorithm in the PMCU 207 may update the path metrics recursively by adding branch metrics to the path metrics of the previous time instant. In some embodiments, the PMCU 207 may store the previous iterations of the path metric in at least one register, such as the path metric register 208. In such instances, the PMCU 207 may retrieve the path metric from the path metric register 208 and the branch metric from the branch metric register 206, appending the branch metric to the retrieved path metric. In some embodiments, during every clock cycle, the PMCU 207 may update the plurality of path metrics produced by the BMCU 205. For example, after receiving the branch metrics for stage 5, the PMCU 207 map append the branch metrics of the new stage to a stored path metric. For example, if the PMCU 203 previously decided on the "11" branch from the terminal state, the PMCU 207 may add metrics associated with the "01" and "10" branches, respectively, to the stored path metric.

In some embodiments, the PMCU 207 may then compare the outcomes of the two appended paths. PMCU 207 may compare the path metrics of the two paths by conducting a subtraction of the two candidate path metrics, with the most significant bit of the difference pointing to a larger one of the two. For example, if the "10" transition has a smaller metrics than the "01" transition, the path metric containing the "10" transition will be smaller, as the two paths may be identical, except for the appended branch metrics. After performing the subtraction from the path metric with the "01" transition, the "01" path may contain the most significant bit. This may serve as a signal to indicate that the PMCU 207 should select the path metric containing the "10" transition, as it is the smaller. In alternative embodiments, the TBCUTBCU 213 may make the comparison(s) through a similar method.

Trace back memories (TBM) 211 may receive and store the calculated path metrics from the PMCU 207, which may be used by the TBCU 213 to build the complete series of survivor paths. In some embodiments, the TBM 211 may also produce surviving local bit information. In such instances, the trace back unit (TBCUTBCU) 213 may receive the surviving local bit information from the TBM 211 and may construct a series of survivor paths, including an optimal survivor path from the path metrics constructed by the PMCU 207 and the surviving local bit information stored in the TBM 211. The TBM 211 may use a first-in-last-out (FILO) buffer.

Though theoretically requiring the entire input sequence, in many embodiments, paths through the code trellis 100 may generally merge to a common survivor path after a number of iterations. However, the decoding may still be unique up to the point that multiple paths merge to the terminal state. The depth at which all the survivor paths merge with high probability may be defined as the survivor path length. In some embodiments, the TBM 211 may be only be large enough to store the decoded bits up to the number of survivor paths. In some embodiments, the TBM 211 may receive from the PMCU 207 a plurality of trace back bits to indicate a chosen path for each of the stored survivor paths. The survivor paths constructed by the TBCU 213 may therefore store a collection of the received trace back bits in sequence. In some embodiments, the TBM 211 may receive the trace back bits from at least one decision bit register, which may receive the trace back bits outputted from the PMCU 207 during a given clock cycle.

For example, the Viterbi decoder 200 may use the trace back method of the Viterbi algorithm to create the decoded bit sequence from the incoming input bits that comprise the convolutional code. When using the trace back method, for all of the $2^m$ states, the Viterbi algorithm may store a trace back bit. The trace back bit may indicate which of two incoming edges was selected by the PMCU 207. Accordingly, the TBCU 213 may need to construct survivor paths of $2^m$ length. The Viterbi may build the survivor paths by recursively constructing the possible symbols from a specified time k to k−1, for example.

The survivor paths of the trace back method may eventually merge as more bits are added, with all paths merging to the same value. In some instances, the survivor paths may merge to a common symbol to a state later in the code trellis 100; for example, a plurality of survivor paths being constructed from the receipt of a bit at stage 7 may merge to a common symbol by stage 0. In some embodiments, once multiple survivor paths merge to a common symbol, they may not diverge again during an earlier stage in the trellis. If, for example, two survivor paths merge at stage 3, they will then share common values at stages 0-2.

Trace back unit (TBCUTBCU) 213 may construct a series of survivor paths based on the path metrics generated by the PMCU 207. In some embodiments, the TBCU 213 may also select the path with the minimum overall value for its path metrics. When making a selection decision during a given clock cycle, the TBCUTBCU 213 may discard old values in each of the survivor paths. In some embodiments, the TBCUTBCU 213 may also discard non-optimal paths and output the chosen path as the optimal path. For example, when the "10" branch is the smaller metric, the TBCUTBCU 213 may construct a survivor path using the "10" branch metric received from the PMCU 207. In some embodiments, the TBCU 213 may also select its associated path as the optimal survivor path. The smaller path metric of the two is selected to be the new path metric to construct the survivor path for a given state. When all the input data is processed through the BMCU 205, the PMCU 207, and the TBCU 213, the complete minimum path metric outputted may be the complete optimal survivor path that represents the best-likelihood estimation of the input sequence into the binary convolutional encoder. In some embodiments, for example, the minimum path metric may have the smallest value for its path metric relative to the received sequence. Recursively tracing backwards along the code trellis 100 of the state transitions used by the binary convolutional encoder, the optimal survivor path chosen by the TBCUTBCU 213 may represent the most likely sequence of transmitted data as it entered the binary convolutional encoder. In some embodiments, the TBCUTBCU 213 may also send information back to other components of the Viterbi decoder 200, such as address information to the TBM 211 or the PMCU 207. In some embodiments, the TBCUTBCU 213 may also relay configuration information sent from the controller 217.

RIRO memory 201 may be a circuit or device, such as a random-access memory (RAM) circuit, that stores state information received from the data input. In some embodiments, the RIRO memory 201 may store a small portion of the bitstream. In some embodiments, the Viterbi decoder 200 may process a received bitstream twice. In such instances, the Viterbi decoder 200 may retrieve the portion of the bitstream that needs further processing from the RIRO memory 201 instead of receiving the entire bitstream again from the transmission or storage channel through which it initially received the message. In some embodiments, the size of the RIRO memory 201 may be in proportion with the size of the binary convolutional codeword. For example, if the entire binary convolutional codeword is a defined block size, the size of the RIRO memory may be equal to the sum of the header and tail of the binary convolutional codeword.

Registers 206, 208, 209 may be one or more memory units that store data outputted from various computation units. For example, the branch metric register 206 may receive and store branch metric values outputted from the BMCU 205. Similarly, the path metric register 208 may store the path metric values outputted from the PMCU 207. Decision bit register 209 may also receive the trace back bits outputted from the PMCU 207 before the additional trace back bits are appended to the path metrics stored in the TBM 211 and/or the trace forward and select unit (TFSU) 215.

In some embodiments, the trace forward and select unit (TFSU) 215 may be used when the Viterbi decoder implements a hybrid of the trace back method and the register exchange method. In such instances, the TFSU 215 may be used along with the TBM 211 to predict the possible state sequence, which may be used to increase the speed of the calculations involved in the trace back method.

Controller 217 may receive information from various components in the Viterbi decoder and may modify the configuration of various component devices in the Viterbi decoder based on the received information and/or the chosen standard currently in use by the Viterbi decoder 200. In some embodiments, the controller 217 may control and/or modify the RIRO memory 201, the multiplexer 203, the BMCU 205, the registers 206, 208, 209, the PMCU 207, the TBM 211, the TBCUTBCU 213, the TFSU 215, or the BER monitor 219 through one or more distinct control signals.

In some embodiments, the controller 217 may modify one or more of the components based on a defined standard. A communication standard, such as those used by XM, HD-radio AM, UMTS, or 802.11g may use different convolutional codewords and thus require different configurations of one or more components in the Viterbi decoder 200 to work effectively and efficiently. Some of the configuration changes may be the result of differences in code rate, constraint length, and/or the code generator polynomial used by a binary convolutional encoder to construct the convolutional codeword.

For example, the code rate, which may be equal to k/n, may be defined as the ratio of the number of bits inputted into the convolutional encoder (k) to the number of channel symbols outputted by the convolutional encoder (n). Similarly, the code generator polynomials may correspond to the shift register connections to the upper and lower modulo-2 adders in the encoder. In some instances, the polynomials are written in octet format, so that the polynomials 131 and 171 represent the binary numbers 1011011 and 1111001, respectively. In some embodiments, the controller 217 may use the code rate and the code generator polynomials to change the configuration of the BMCU 205. In some instances, the configuration changes to the BMCU 205 may be to mirror the configuration of the binary convolutional encoder used to create the standard convolutional encoder.

Similarly, the constraint length k may be defined as the length of the convolutional encoder. The constraint length may detail how many k-bit stages are available to feed combinational logic that produces the output signal. Closely related to the constraint length may be the parameter m, which is equal to k−1. The parameter may detail how many encoder cycles an input bit is retained and used for encoding after it appears at the input to the convolutional encoder.

In some embodiments, the controller 217 may use the value of the constraint length to modify the PMCU 207, TBM 211, TBCUTBCU 213, or TFSU 215 in order to properly decode the incoming convolutional codeword. For example, in the illustrative embodiment, the TBM 211 contains four memory units for trace back, each with a bit width of 64. For a given constraint length k, $2^{k-1}$ states may be saved in the TBM 211. So when the constraint length is 7, the corresponding 64 states may be saved in one memory unit. Controller 217 may therefore power down the other three memory units. In some embodiments, the memory units may power down automatically when the constraint length is below or equal to 7. In some embodiments, the controller 217 may also modify the PMCU 207, TBM 211, TBCUTBCU 213, or TFSU 215 when it is determined that the Viterbi decoder 200 needs to process incoming convolutional codewords using tail-biting techniques or needs to process convolutional codewords concurrently.

Bit error rate (BER) monitor 219 may be included in some embodiments of the Viterbi decoder 200 to compare the optimal survivor path chosen by the TBCUTBCU 213 and the received sequence. In some embodiments, the BER monitor 219 may make its comparison by comparing the difference between the optimal survivor path and the received sequence against a defined threshold. In some embodiments, the BER monitor may use a defined threshold set by the controller 217 that may be based on the standard currently in use. When the calculated difference is greater than the defined threshold, the BER monitor 219 may, for example, trigger an alarm. In some embodiments, the alarm may trigger the controller 217 to modify the configuration of at least one of the other components of the Viterbi decoder 200, such as the BMCU 205 or the PMCU 207.

Figure 3A:
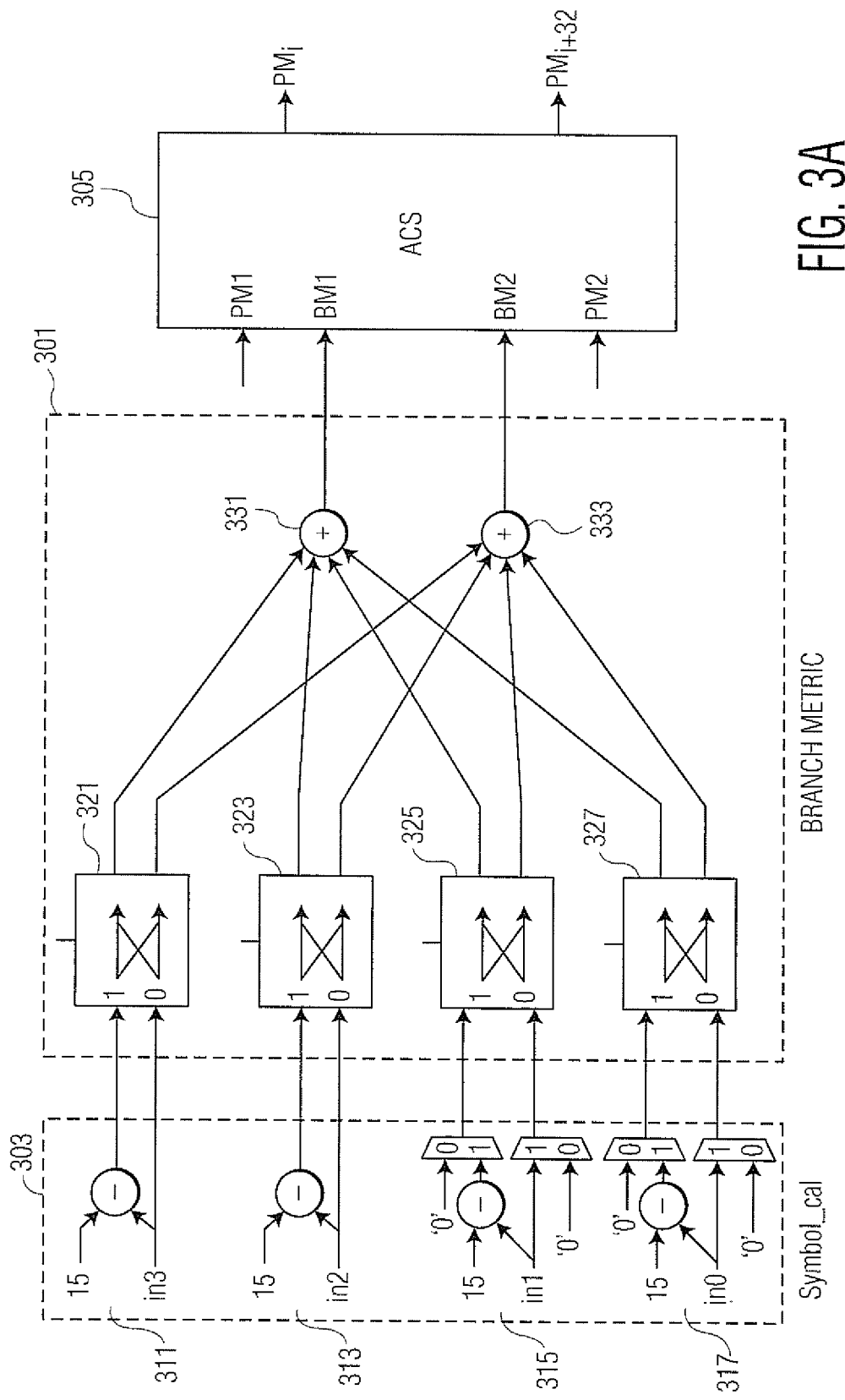
FIG. 3A illustrates a functional block of an exemplary branch metric computation unit (BMCU)

FIG. 3A illustrates a functional block of an exemplary branch metric computation unit (BMCU). A BMCU such as the BMCU 205 of the Viterbi decoder 200 of FIG. 2 may comprise one or more of BMCU sub-units 301. For example, the BMCU 205 may comprise of 32 sub-units similar to BMCU sub-units 301. Each sub-unit 301 may receive a plurality of inputs from input block 303 and may output one or more branch metrics. In the illustrative embodiment, the branch metric outputs BM1 and BM2 may be outputted directly into an add-compare-select (ACS) unit 305 of a PMCU, such as PMCU 207 of the Viterbi decoder 200. In alternative embodiments, the branch metric outputs may first be entered into one or more branch metric registers.

Input block 303 may comprise one or more input logic circuits 311-317 that may receive a data input and may, through a logic circuit, output either a logical "1" or a logical "0" to an input of the sub-unit 301. In the illustrative embodiment, the 4 logic circuits 311-317 may transmit 8 inputs into the sub-unit 301. From these inputs, the branch metric calculators 321-327 may take a pair of inputs and may calculate 4 branch metrics for the pair of inputs. The branch metric values may be added together in adders 331, 333, which may then output the resultant sums as one or more branch metric values. In the illustrative embodiment, the sub-unit 301 may be configured to output 2 branch metrics, BM1 and BM2, from 8 inputs. Adders 331, 333 may take an input from each of the branch metric calculators 321-327 to output the two branch metrics.

In some embodiments, the controller 217 may change the configuration of a sub-unit 301 by changing the inputs into one or more input. In such embodiments, controller 217 may modify the inputs into at least one input logic circuit 311-314 to be a constant. For example, when the current standard requires a code rate of ½ or ⅓, the controller may change an input value for in1 at logic circuit 315 or in0 at logic circuit 317 to be a logical "0." Similarly, the controller 217 may also use the value of the polynomials in the standard to generate a plurality of control signals to control the multiplexers each of the input logic circuits 315, 317.

FIG. 3B illustrates a functional block of an exemplary path metric computation unit (PMCU). PMCU 400 may be similar to the PMCU 207 of the Viterbi decoder 200. Multiplexers 341 and 342 may receive path_in_1 and path_in_2, respectively. In some embodiments, the input paths may originate from one or more path metric registers, such as the path metric register 208 in the Viterbi decoder 200. The outputs of the multiplexers 341-342 may then be transmitted to a plurality of add-compare select (ACS) circuits 351-355. In some of the embodiments, there may be symmetry in the path metric calculations performed by each of the ACS circuits 351-355. In such instances, the two input path metrics received from the multiplexers 341-342 may be computed in an ACS butterfly, which may lower the number of accesses to the path registers and may increase the speed of the operation. In some embodiments, each of the ACS circuits 351-355 may comprise an ACS butterfly, which may comprise of 2 connected ACS units. In the illustrative embodiment, the PMCU 400 may comprise of 32 ACS circuits, so that the PCMU 400 may include 64 ACS units. Each of the ACS circuits 351-355 may consume two path metrics and may generate two new path metrics based on the input.

In the illustrative embodiment, for example, the 32 ACS circuits 351-355 may process the incoming path metrics from the path metric registers and may output a different series of path metrics through the multiplexers 361-362. Multiplexers 361-362 may output two signals, path_out_1 and path_out_2, that are reordered from the incoming path metrics and also include additional branch metrics feed from the BMCU 205 (or branch metric registers 205).

As shown by the ACS circuit 305 in FIG. 3A, the ACS circuit 305 may receive a pair of branch metrics from produced one of the 32 BMCU sub-units 301. ACS circuit 305, in a similar manner to the ACS circuits 351-355, may take the incoming path metrics and branch metrics and may produce new path metrics based on these inputs. For example, the ACS circuit 305 may use PM1 and BM1 to produce $PM_i$, while also using PM2 and BM2 to produce $PM_{i+32}$. In alternative embodiments, the ACS circuit 305 may produce path metrics based on other combinations of incoming path metrics and branch metrics. In some embodiments, this may enable the path metrics registers 208 to store the path metrics sequentially.

Controller 217 may modify the configuration of the PMCU 340. Controller 217 may use the constraint length to determine the number of possible states. For example, when k=5, there may be $2^{k-1}=16$ states. Similarly, when k=9, there may be 256 states. Based on the number of states, the composition of the input and output path metrics may be modified. At each clock cycle, a quantity of survivor bits, or trace back bits, equal to the number of possible states may be produced. As will be discussed in further detail below in relation to FIG. 3C, the path metric registers may be configured based on the number of survivor bits produced to modify the stored path metrics. In some embodiments, the controller 217 may power down some of the ACS circuits 351-355 when they are not necessary for processing, such as when the constraint length is 5 and only 16 survivor bits are produced.

Figure 3C:
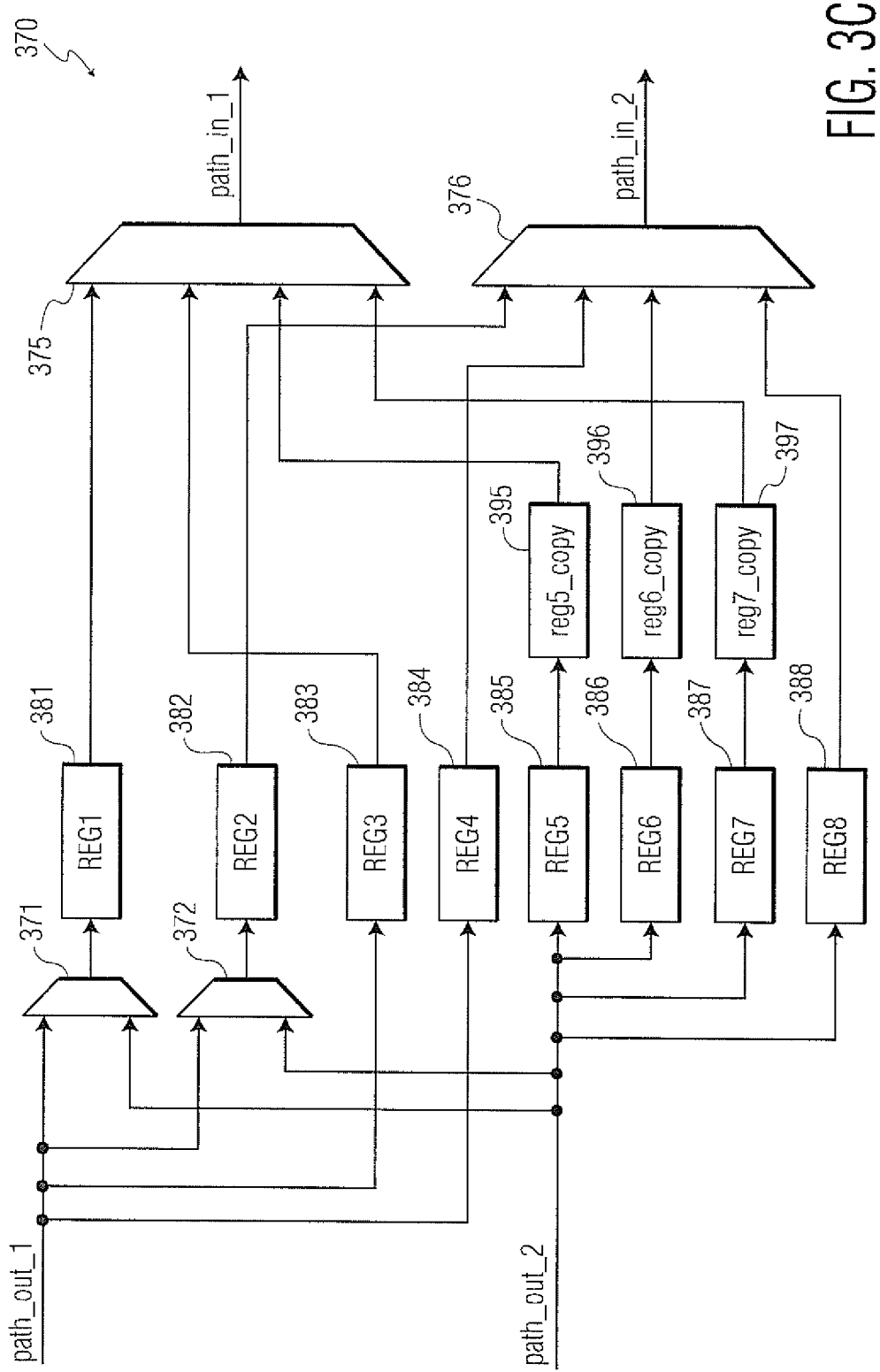
FIG. 3C illustrates a functional block of a exemplary path metric registers.

FIG. 3C illustrates a functional block of exemplary path metric registers. Path metric registers 370 may be similar to the path metric register 208 in the Viterbi decoder 200. Path metric registers 370 may comprise of a plurality of multiplexers 371, 372, 375, 376, and a plurality of active path metric registers 381-388. In some embodiments, the path metric registers 370 may also include one or more path register copies 395-397. Each of the active path registers 381-388 and path metric register copies 395-397 may store, for example, 32 path metrics. The path metric registers 370 may temporarily store a portion or an entire path metric between iterations through the ACS circuits 351-355. The path metric stored in the path metric registers 370 may be used as inputs on which to append branch metrics from the next trellis step during the next clock cycle.

Controller 217 may modify the configuration of the path metric registers 370. For example, the number of active path registers 381-388 may depend on the defined constraint length, as the number of active path registers 381-388 may depend on the number of possible states. For example, when the constraint length is 5, there may be $2^{k-1}=16$ states, so that only active register 381 needs to be active to store the 16 states. In such instances, the first eight values from each of path_out_1 and path_out_2 produced by the PMCU 340 may be stored by the active path register 381. Similarly, when the constraint length is 7 and there are 64 possible states, both the active path registers 381-382 may store 32 path metrics each. In some embodiments, the active path register 381 may store the path_out_1 path metrics, while the active path register 382 may store the path_out_2 path metrics.

For longer constraint lengths, like when the constraint length is 9, there may be a larger number of states (e.g., 256). In such instances, some of the active path registers may be grouped together. For example, in the illustrative embodiment, active registers 381 and 385 may be coupled together, while active registers 382 and 386 are coupled together, respectively (following the pattern, active registers 383 and 387 are coupled, while active registers 384 and 388 may comprise the final pair). Each of the groups may in turn receive path metrics from either path_out_1 or path_out_2, saving data to later be processed by the PMCU 340. In some embodiments, the path register copies 395-397 may be used to shadow the active path metric registers 385-387. The shadow of the path metrics stored in the path register copies 395-397 may prevent overwriting in subsequent clock periods.

Figure 4A:
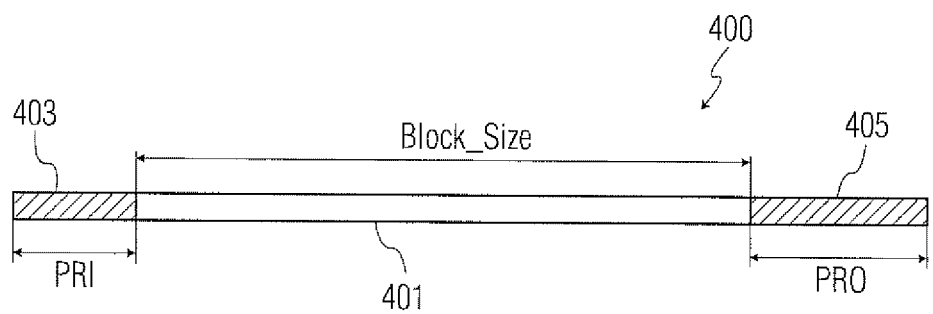
FIG. 4A illustrates an exemplary decoding process performed by the Viterbi decoder.

FIG. 4A illustrates an exemplary decoding process performed by the Viterbi decoder. The binary convolutional code block 400 may comprise an initial code block 401, period run in (PRI) block 403, and period run out (PRO) block 405. A Viterbi decoder, such as the Viterbi decoder 200 of FIG. 2, may receive a convolutional code that was encoded using a tail-biting technique. Accordingly, the Viterbi decoder 200 may employ a tail-biting decoding technique to decode the received convolutional codeword 400. The tail-biting convolutional code 400 may have had the last information bits used as initial states of the encoder. Similarly, the Viterbi decoder 200 may receive multiple convolutional codes and may attempt to decode the codes concurrently. Accordingly, the Viterbi decoder 200 may employ the RIRO memory 201 to store values in order to process some of each of the convolutional codes twice. The multiple processing of specific portions of the received convolutional code may enable the Viterbi decoder to retain the accuracy associated with recursive processing; as such data may otherwise be discarded and lost when switching between the convolutional codes.

Initial code block 401 may include a header and a tail. The header may be the first part of the initial code block 401. In some embodiments, the Viterbi decoder 200 may store the header, or the header and additional bits, into the RIRO memory 201. In some embodiments, the size of the header may be equal to the size of one trace back depth D, which may be a multiple of the constraint length k and dependent on the code rate. For example, when the code rate is ½, a trace back depth D may equal 5 to 7 times the constraint length. In some embodiments, the trace back depth may also be based on the threshold for the bit error rate. In some embodiments, the header may comprise the entire initial code block 401. For example, a standard such as LTE has a block size of 80, which may enable the header to be equivalent to the block size. Similarly, the tail may be the last part of the initial code block 401. In some embodiments, the Viterbi decoder 200 may store the tail, or the tail and additional bits, into the RIRO memory 201.

PRI block 403 may be appended to the front of the initial code block 401. PRI block 403 may contain the end data from the previous block. As will be discussed in relation to FIG. 4D, PRI block 403 may be used when the Viterbi decoder 200, for example, is processing multiple convolutional codes. This may enable the Viterbi decoder 200 to recalculate a portion of the final bits of the stream when switching back to further process the stream. This recalculation may enable the Viterbi decoder to switch between streams without a great loss in accuracy, while also negating a requirement of further processing the entire input convolutional code 401. In some embodiments, the controller 217 may control the size of the PRI block 403 saved in the RIRO memory 201.

PRO block 405 may be appended to the end of the initial code block 401. PRO block 405 may contain the header of the current block. As will be discussed in relation to FIGS. 4B-4C, PRO block 405 may be used when the Viterbi decoder 200, for example, is processing tail-biting convolutional codes. This may enable the Viterbi decoder 200 to further process the header of the previous block to do pre-trace back before processing a newly incoming initial block similar to 401. In some embodiments, the Viterbi decoder 200 may attain the ending state of the initial block 401 and may then perform decoding on the tail, which may comprise the PRO block 405. In some embodiments, the Viterbi decoder 200 may use both the PRI block 403 and the PRO block 405 to, for example, concurrently process tail-biting convolutional codes.

Figure 4B:
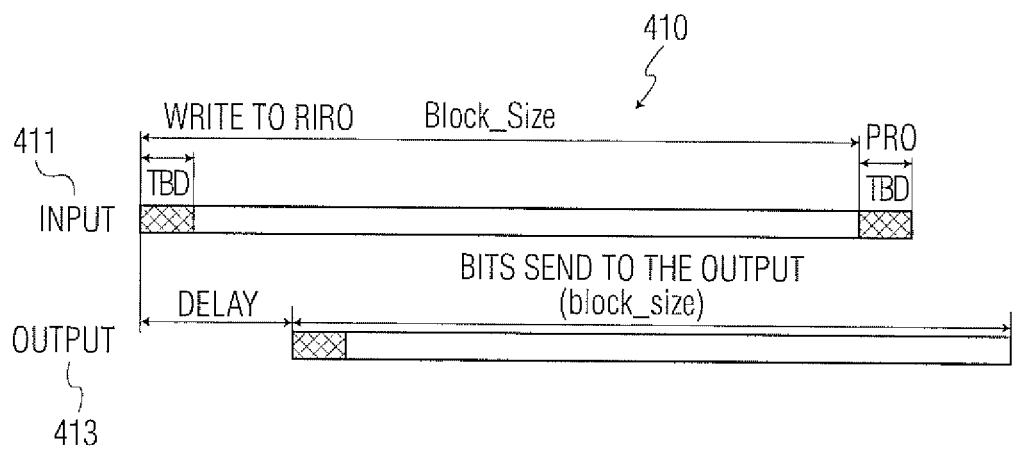
FIG. 4B illustrates an exemplary tail-biting decoding process performed by the Viterbi decoder.

FIG. 4B illustrates an exemplary tail-biting decoding process performed by the Viterbi decoder. In the illustrative embodiment, the Viterbi decoder 200 may be using a tail-biting method to decode the tail-biting convolutional codeword 401. In the tail-biting scheme 410, the input bit stream 411 includes an initial code block and a PRO block. In the illustrative embodiment, the entire initial code block may be written to the RIRO memory 201. In some embodiments, the Viterbi decoder may switch to receive from the RIRO memory 201 a portion of the initial code block, such as the header of the initial code block (in the illustrative embodiment, equal to the trace back depth TBD).

Upon processing the input bit stream 411, the Viterbi decoder 200 may output an output bit stream that includes a sequence of decoded bits. The size of the output bit stream may be equal to the size of the initial code block. While the Viterbi decoder 200 may process the header of the initial code block twice, the output merely has the header of the initial code block once. In processing the PRO block, the there may be a delay between the receipt of the initial code block and the output of the output bit stream. This delay may be defined as the pipe-line delay and may be a function of the size of the portion of the initial code block the Viterbi decoder 200 further processes from the RIRO memory 201.

Figure 4C:
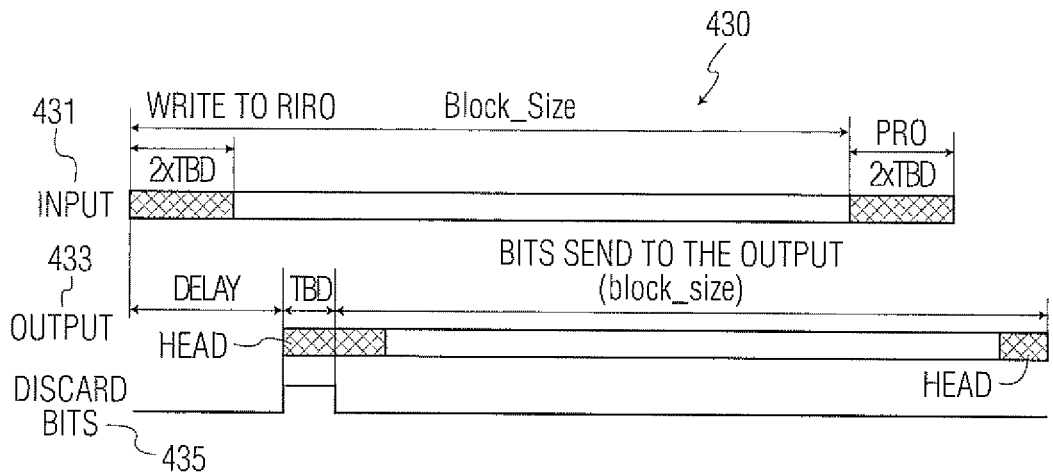
FIG. 4C illustrates another exemplary tail-biting decoding process performed by the Viterbi decoder.

FIG. 4C illustrates another exemplary tail-biting decoding process performed by the Viterbi decoder. Viterbi decoder 200 may employ tail-biting scheme 430, for example, when initially processing a tail-biting convolutional code. When all initial paths are zero, there may be a larger error done by Viterbi decoder 200, so the decoding results may more likely be wrong. In such instances, the input stream 431 may contain an initial code block and a concatenated PRO block that may be at least twice the size of the trace back depth. When the Viterbi decoder 200 switches to receive bits from the RIRO memory 200, the Viterbi decoder 200 may process a header that is at least twice the size of the trace back depth. The extra TBD worth of the header may be used by the Viterbi decoder 200 to do pre-trace back of the input bitstream, which may, for example, enable more accurate decoding. As the first TBD length of the header processed may not be as accurate, the Viterbi decoder may discard the first TBD 435 of output bits from the output stream 433, while retaining the rest of the output bitstream 433.

Figure 4D:
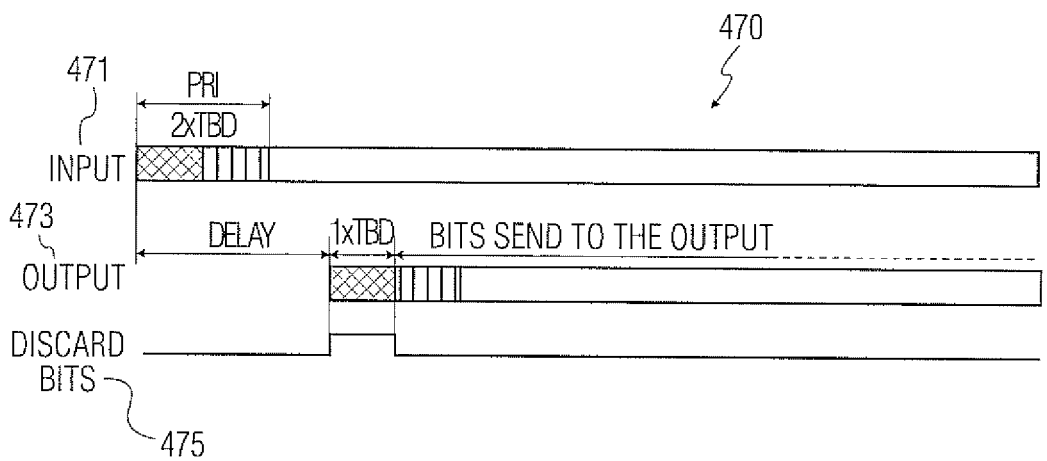
FIG. 4D illustrates an exemplary decoding process performed by a Viterbi decoder employing concurrent decoding.

FIG. 4D illustrates an exemplary decoding process performed by a Viterbi decoder employing concurrent decoding. Viterbi decoder 200 may employ concurrent scheme 470 when decoding at least two input bit streams concurrently. Concurrent scheme 470 illustrates one of the input bit streams 471 and its associated output 473. In a similar method to that of tail-biting scheme 430 in FIG. 4C, the Viterbi decoder may also discard a portion of the output 475.

In one embodiment, a first portion of G bits of the input stream 471 may be received and processed by the Viterbi decoder 200. Viterbi decoder 200 may discard the first bits equal to the TBD, resulting in G-TBD valid bits in the output bitstream 473. Viterbi decoder 200 may also have a portion of the input stream 471 written to the RIRO memory 201. In the illustrative embodiment, for example, the RIRO memory receives a portion of the input bitstream 471 equal to the TBD. Viterbi decoder 200 may then switch to process another input bitstream (not shown).

When the Viterbi decoder switches back to process the input bitstream 471, the Viterbi decoder 200 may process the PRI block of the input stream 471 before attempting to process another portion of H bits of the input bitstream 471. In the illustrative embodiment, the Viterbi decoder may process a PRI block equal to twice the TBD and may discard a portion 475 of the processed PRO block. Viterbi decoder may then process and output a portion equal to H+TBD bits of the output bitstream 473. In some embodiments, the controller 217 may specify the size of the discarded bit portion 475. Controller 217 may base the size of the discarded bit portion on, for example, the signal-to-noise ratio of the transmission or storage channel.

Figure 5A:
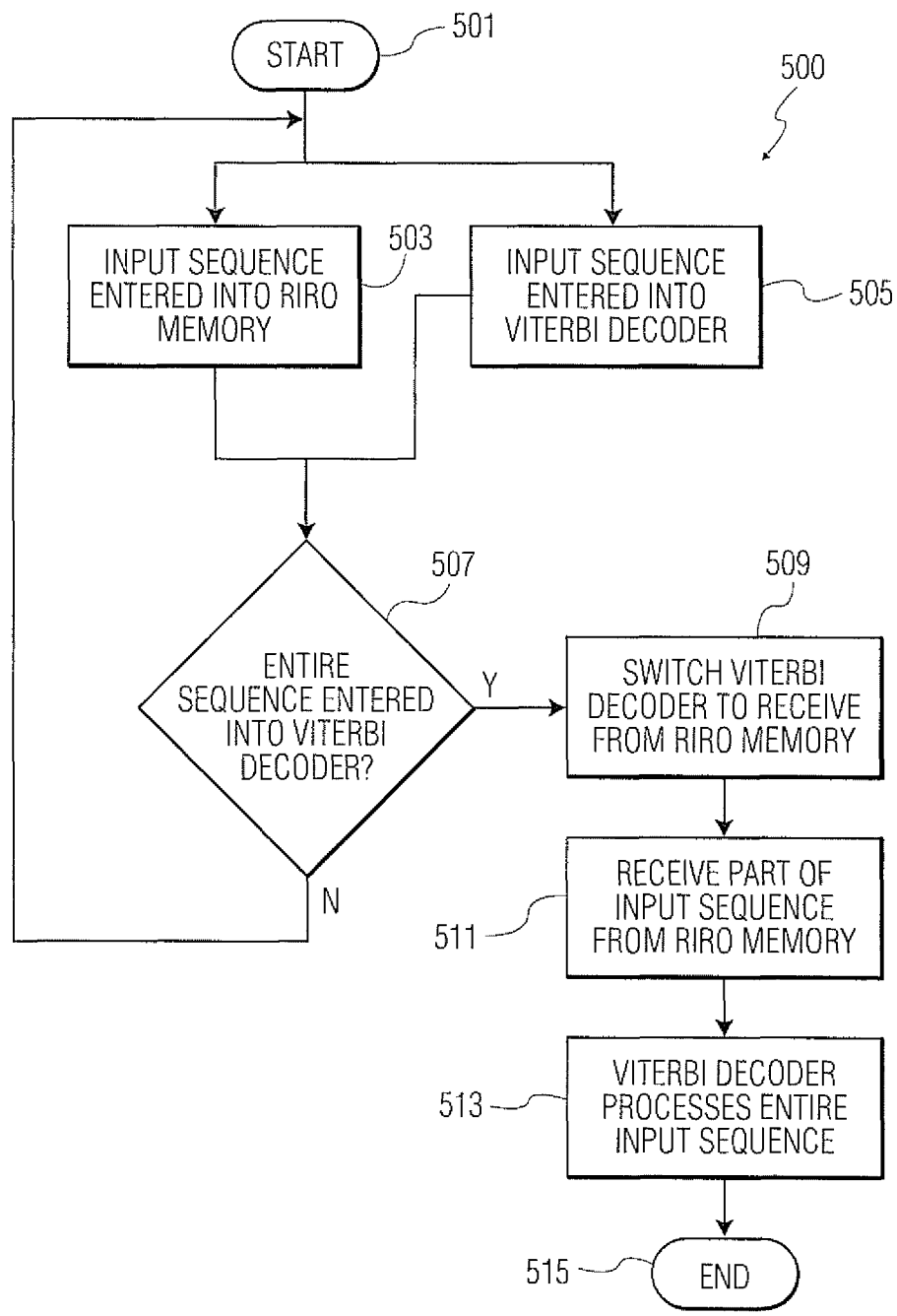
FIG. 5A illustrates an exemplary flowchart for decoding a tail-biting convolutional code.

FIG. 5A illustrates an exemplary flowchart for decoding a tail-biting convolutional code. A Viterbi decoder 200 may employ method 500 when processing and decoding, for example, a tail-biting convolutional code. Method 500 may start at 501 and proceed to steps 503-505, where an input sequence, such as 411 or 431, including an initial code block is entered into the RIRO memory 201 and the Viterbi decoder 200 via the multiplexer 203. In some embodiments, step 503 and step 505 may implemented by the Viterbi decoder 200 in parallel. In some embodiments, the Viterbi decoder 200 may process at output an output bitstream 413 or 433 from the input bitstream received in steps 503-505. In alternative embodiments, the Viterbi decoder may wait until step 513 to process the entire input sequence. Viterbi decoder 200 may then in step 507 determine whether the entire input sequence has been entered into the Viterbi decoder. If it has not, the Viterbi may return to steps 503-505 until the entire input bitstream 431 is entered. When the entire input bitstream 431 is entered, the Viterbi decoder 200 may proceed to step 509.

In step 509, the Viterbi decoder 200 may switch to receive inputs from the RIRO memory 201 and in step 511 retrieve a portion of the input bitstream 431 from the RIRO memory 201. In some embodiments, the controller 217 may determine the length of the portion the Viterbi decoder 200 receives from the RIRO controller 201. For example, the controller 217 may initially set the portion to equal twice the trace back depth (2*TBD) and later change the length to equal the trace back depth (TBD). The Viterbi decoder 200 may then in step 513 process the portion received from the RIRO memory 201. In some embodiments, the Viterbi decoder 200 may only process the PRO block of the input stream 411. In other embodiments, the Viterbi decoder 200 may process the PRO block and the entire input stream initially received in step 505. Once the entire input sequence is processed, the method may end at step 515. In alternative embodiments, the Viterbi decoder 200 may in step 513 process the PRO block of the input bitstream 411 and then receive and process an additional input bitstream received after the bitstream in step 505.

Figure 5B:
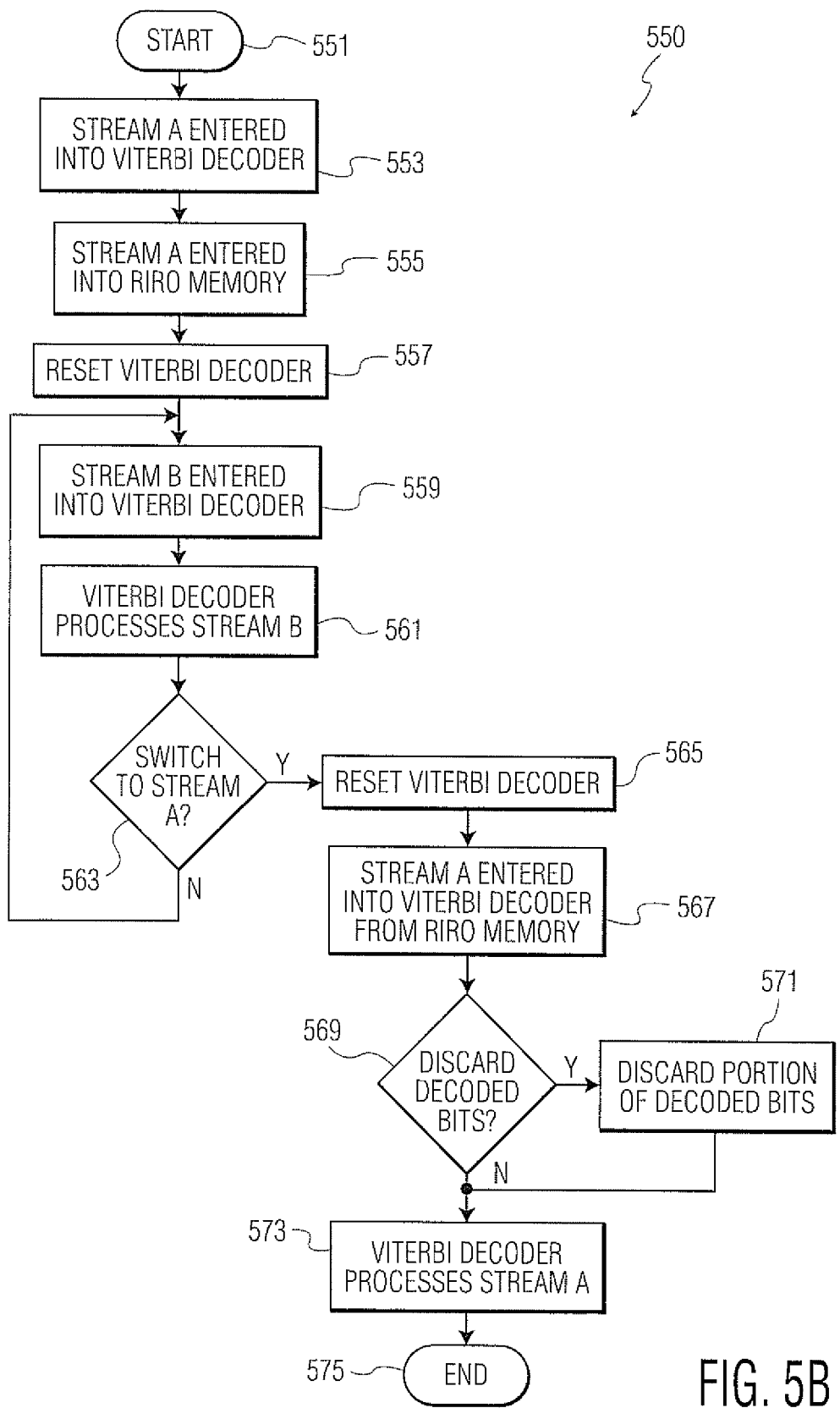
FIG. 5B illustrates another exemplary flowchart for concurrently decoding multiple binary convolutional codes.

FIG. 5B illustrates another exemplary flowchart for concurrently decoding multiple binary convolutional codes. A Viterbi decoder similar to the Viterbi decoder 200 of FIG. 2 may employ method 550 when processing and decoding more than one convolutional code concurrently. Method 550 may begin at step 551 and proceed to step 553-555, where the Viterbi decoder 200 via multiplexer 203 and the RIRO memory 201 may receive an initial bitstream A. In some embodiments, the Viterbi decoder 200 may also process a portion of bitstream A. In step 557, the Viterbi decoder 200 may reset win order to switch its receipt of input bitstreams.

In steps 559-561, the Viterbi decoder 200 via multiplexer 203 and the RIRO memory 201 may receive the input bitstream B and may process at least a portion of the input bitstream B. In some embodiments, the Viterbi decoder may, for example, process the entire bitstream B before switching back to bitstream A. In step 563, the Viterbi decoder 200 may determine whether to switch back to input bitstream A in step 565 or remain with bitstream B by returning to step 559. In some determinations, the controller 217 may make this determination based on factors such as speed or efficiency. In some embodiments, when the Viterbi decoder 200 determines to switch back to input bitstream A in step 563, the Viterbi decode may also retain a portion of the input bitstream B in the RIRO memory 201.

In step 565-567, the Viterbi decoder 200 may reset and again receive input stream A from the RIRO memory 567. In some embodiments, the controller 217 may determine the portion of bits the Viterbi decoder 200 processes from the RIRO memory before returning to receiving input bitstream A through the multiplexer 203. In step 569, the Viterbi decoder 200 (through, for example, the controller 217) may determine whether to discard a portion of the bits decoded from the RIRO memory 201. When the Viterbi decoder 200 decides to discard bits, in step 571, a defined portion of the output bitstream decoded from the RIRO memory 201 may be discarded. When the defined portion is discarded or when the Viterbi decoder determines that to retain the entire output bitstream decoded from the RIRO memory 201, the Viterbi decoder may in step 573 process a further portion of input bitstream A and end at step 575. In some embodiments, the Viterbi decoder 200 may, for example, process a number of bitstreams by saving portions of multiple bitstreams simultaneously in the RIRO memory 201. In some embodiments, the Viterbi decoder may switch multiple times between input bitstream A and input bitstream B before completing processing of either input bitstream.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A Viterbi processor to decode a convolutional code, the processor comprising:
 a branch metric unit (BMU) comprising a plurality of branch sub-units that receives a first plurality of input bits from a main memory and outputs a first series of branch metrics, wherein a number of active branch sub-units of the plurality of branch sub-units is based on a programmable generator polynomial and a programmable code rate;
 a path metric unit (PMU) comprising a plurality of add-compare-select (ACS) units that receive the first series of branch metrics through a plurality of interconnects and output a first series of path metrics, wherein the configuration of the interconnects is based on a programmable constraint length;
 a number of active path metric registers in a plurality of path metric registers that receive the first series of path metrics and output a second series of path metrics, wherein the number of active path metrics registers from the plurality of path metric registers is based on the programmable constraint length;
 a trace back unit (TBCU) comprising a plurality of memory units that construct a first series of survivor bits from the first series of path metrics, wherein the number of survivor bits stored is based on the programmable constraint length;
 a controller connected to the TBCU that sets values for the programmable generator polynomial, the programmable code rate, and the programmable constraint length; and
 a run-in run-out (RIRO) memory unit that stores a first input bit portion of the first plurality of input bits, wherein the first input bit portion comprises an initial sequence of the first plurality of input bits at least the length of one trace back depth.

2. The processor of claim 1, wherein at least one of the plurality of memory units is powered down when the programmable constraint length is less than or equal to a value of seven.

3. The processor of claim 1, wherein the BMU receives the first input bit portion from the RIRO memory after the first series of survivor bits has been received by the TBCU.

4. The processor of claim 3, wherein the BMU further processes the received first input bit portion to produce a second plurality of branch metrics.

5. The processor of claim 4, wherein the first input bit portion is at least the length of two trace back depths and further wherein the first input bit portion is appended to the end of the first plurality of input bits.

6. The processor of claim 1, wherein the BMU receives a second plurality of input bits after partially receiving the first plurality of inputs, and further wherein the BMU stops receipt of the first plurality input bits to receive the first input bit portion from the RIRO memory and the second plurality of input bits from the main memory.

7. The processor of claim 6, wherein the controller further specifies a segment of discard bits, wherein the TBCU discards the discard bit segment after construction of the first series of survivor paths.

8. A method for a Viterbi decoder to decode a convolutional code, the method comprising:
 receiving, by a branch metric unit (BMU) comprising a plurality of branch sub-units, a first plurality of input bits from a main memory, wherein a number of active branch sub-units of the plurality of branch sub-units is based on a programmable generator polynomial and a programmable code rate;
 receiving, by a path metric unit (PMU) comprising a plurality of add-compare-select (ACS) units, a first series of branch metrics transmitted from the BMU through a plurality of interconnects, wherein the configuration of the interconnects is based on a programmable constraint length;
 receiving, by a number of active path metric registers in a plurality of path metric registers, a first series of path metrics transmitted from the PMU, wherein the number of active path metric registers from the plurality of path metric registers is based on the programmable constraint length;
 outputting, by the number of active path metric registers, a second series of path metrics;
 constructing, by a trace back unit (TBCU) comprising a plurality of memory units, a first series of survivor bits from the first series of path metrics, wherein the number of survivor bits stored is based on the programmable constraint length;
 setting, by a controller connected to the TBCU, values for the programmable generator polynomial, the programmable code rate, and the programmable constraint length; and
 storing, by a run-in run-out (RIRO) memory, a first input bit portion of the first plurality of input bits, wherein the first input bit portion comprises an initial sequence of the first plurality of input bits at least the length of one trace back depth.

9. The method of claim 8, wherein at least one of the plurality of memory units is powered down when the programmable constraint length is less than or equal to a value of seven.

10. The method of claim 8, further comprising:
 receiving, by the BMU, the first input bit portion from the RIRO memory after the constructing step by the TBCU.

11. The method of claim 10, further comprising:
 further processing, by the BMU, the received first input bit portion to produce a second plurality of branch metrics.

12. The method of claim 11, further comprising:
 appending, by the PMU, the first input bit portion to the end of the first plurality of input bits, wherein the first input bit portion is at least the length of two trace back depths.

13. The method of claim 8, further comprising:
stopping, by the BMU, receipt of the first plurality of input bits; and
receiving, by the BMU, a second plurality of input bits from the main memory, wherein the BMU receives the second plurality of input bits after partially receiving the first plurality of inputs; and
receiving, by the BMU, the first input bit portion from the RIRO memory after receiving the second plurality of input bits.

14. The method of claim 13, further comprising:
specifying, by the controller, a segment of discard bits; and
discarding, by the TBCU, the discard bit segment after construction of the first series of survivor paths.

* * * * *